(12) United States Patent
Spiegel

(10) Patent No.: US 7,065,336 B2
(45) Date of Patent: Jun. 20, 2006

(54) ANALOG BASE BAND UNIT FOR A RF RECEIVER AND METHOD FOR USING THE SAME

(75) Inventor: Solon Spiegel, Zurich (CH)

(73) Assignee: u-blox ag, Thalwil (CH)

( * ) Notice: Subject to any disclaimer, the term of this patent is extended or adjusted under 35 U.S.C. 154(b) by 482 days.

(21) Appl. No.: 10/173,875

(22) Filed: Jun. 19, 2002

(65) Prior Publication Data

US 2003/0017815 A1    Jan. 23, 2003

(30) Foreign Application Priority Data

Jun. 19, 2001   (EP)   ................................. 01810598

(51) Int. Cl.
  *H04B 1/06*   (2006.01)
(52) U.S. Cl. ............................... 455/244.1; 455/181.1; 455/234.1; 455/232.1; 330/281; 330/282
(58) Field of Classification Search ............. 455/232.1, 455/234.1, 234.2, 241.1, 126, 296, 244.1, 455/181.1; 330/280, 281, 282
  See application file for complete search history.

(56) References Cited

U.S. PATENT DOCUMENTS

| | | | |
|---|---|---|---|
| 4,422,049 A * | 12/1983 | Akagiri et al. ............... | 330/281 |
| 5,231,360 A * | 7/1993 | Storey ......................... | 330/281 |
| 5,376,895 A * | 12/1994 | Aihara ......................... | 455/126 |
| 5,408,197 A * | 4/1995 | Miyake ........................ | 330/282 |
| 5,471,665 A * | 11/1995 | Pace et al. ................. | 455/343.2 |
| 5,474,342 A * | 12/1995 | Smith et al. ............... | 455/234.2 |
| 5,617,060 A | 4/1997 | Wilson et al. | |
| 5,724,653 A * | 3/1998 | Baker et al. ................. | 455/296 |
| 5,901,347 A | 5/1999 | Chambers et al. | |
| 6,009,126 A * | 12/1999 | Van Bezooijen ............ | 455/306 |
| 6,259,321 B1 * | 7/2001 | Song et al. .................. | 330/280 |
| 6,373,907 B1 * | 4/2002 | Katsura et al. .......... | 455/234.2 |
| 6,459,889 B1 * | 10/2002 | Ruelke ..................... | 455/234.1 |
| 6,498,929 B1 * | 12/2002 | Tsurumi et al. ............. | 455/296 |
| 6,545,534 B1 * | 4/2003 | Mehr ......................... | 330/284 |

(Continued)

FOREIGN PATENT DOCUMENTS

JP                56158511  A  *  12/1981

*Primary Examiner*—Lana Le
(74) *Attorney, Agent, or Firm*—Oblon, Spivak, McClelland, Maier & Neustadt, P.C.

(57) ABSTRACT

A feedback circuit for amplification of the output signal of an analog front end and suppression of its DC and low frequency components comprises a variable gain amplification unit (2) controlled by a gain control signal and a reverse path unit (6) comprising a filter unit (8) with variable time constant. A control unit (13) produces the gain control signal as well as a reverse path control signal (S) which causes adaptation of variable resistances (12) and capacitances (10) in such a way that the time constant of the filter unit (8) varies essentially proportionally with the gain of the variable amplifier unit (2). Thereby the gain of the feedback circuit as a function of the frequency retains its shape with varying gain. As the reverse path control signal (S) can be produced from different inputs selectable by selectors (20a, 20b) in the control unit (13) and due to the adaptability of the reverse path unit (6) and other features the analog base band unit is suited for the processing of signals of various types, e.g. signals pertaining to GPS and mobile telecommunication systems.

22 Claims, 4 Drawing Sheets

U.S. PATENT DOCUMENTS

| | | |
|---|---|---|
| 6,560,447 B1 * | 5/2003 | Rahman et al. .......... 455/232.1 |
| 6,560,448 B1 * | 5/2003 | Baldwin et al. ......... 455/234.1 |
| 6,577,188 B1 * | 6/2003 | Ueno et al. ................. 330/282 |
| 6,590,448 B1 * | 7/2003 | Burt ........................... 330/280 |
| 6,677,834 B1 * | 1/2004 | Rafalczik et al. ........... 333/181 |
| 6,795,694 B1 * | 9/2004 | Uesugi ....................... 455/126 |
| 6,871,055 B1 * | 3/2005 | Hirano et al. ............ 455/232.1 |
| 2001/0036811 A1 * | 11/2001 | Kianush et al. ................ 455/41 |
| 2002/0000883 A1 * | 1/2002 | Cox ........................... 330/282 |
| 2002/0084842 A1 * | 7/2002 | Yao et al. ....................... 330/9 |
| 2002/0142745 A1 * | 10/2002 | Kang et al. ............... 455/232.1 |
| 2002/0151289 A1 * | 10/2002 | Rahman et al. .......... 455/232.1 |
| 2002/0159544 A1 * | 10/2002 | Karaoguz ................... 455/205 |

* cited by examiner

ANALOG BASE BAND UNIT FOR A RF RECEIVER AND METHOD FOR USING THE SAME

FIELD OF THE INVENTION

The invention concerns an analog base band unit for a RF receiver according to the precharacterizing clause of claim 1. Units of this type are used in receivers serving various purposes, in particular receivers used in wireless or TV sets, cellular phones or GPS kits. The invention also concerns a method for using the inventive analog base band unit to process a GPS signal.

PRIOR ART

Many analog base band units of the generic type are known. One particular problem associated with known designs is that the automatic gain control methods used do not compensate for changes in the filter characteristics of the system that go along with variations of the gain. This may lead to shifts in cut-off frequencies resulting in insufficient suppression of DC and low frequency components resulting from local oscillator self-mixing or blocking self-mixing effects. Problems of this type are particularly severe if signals of widely differing properties are to be processed by the receiver.

It is therefore an object of the invention to provide an analog base band unit for a RF receiver of the generic type which will work dependably with signals requiring widely varying gain. Another object of the invention—which is related to the above-mentioned object—is to provide an analog base band unit for a multi-standard RF receiver capable of processing RF signals of quite different properties, in particular signals pertaining to the GPS system and to wireless communication systems.

SUMMARY OF THE INVENTION

The analog base band unit according to the invention offers continuous adaptation of its filter characteristics to the properties of the signal and in particular to the gain of the variable gain amplifier unit. In particular, the cut-off frequency or frequencies can be kept essentially constant by compensating for the effects of varying gain.

With appropriate modifications the analog base band unit can be adapted to various signal types implicating widely differing requirements, in particular frequency hopping systems like bluetooth requiring very fast responses on the one hand and TDMA, CDMA and GPS where response time requirements are more moderate but where, e.g., the intermittent character of the processed signal poses problems of a different type or where low power consumption requirements are particularly stringent. At the same time, the analog base band unit according to the invention offers efficient suppression of low frequency components, in particular DC offset.

BRIEF DESCRIPTION OF THE DRAWINGS

In the following the invention is described in more detail with reference to drawings showing an embodiment of the invention where.

DESCRIPTION OF THE PREFERRED EMBODIMENTS

Figure 1:
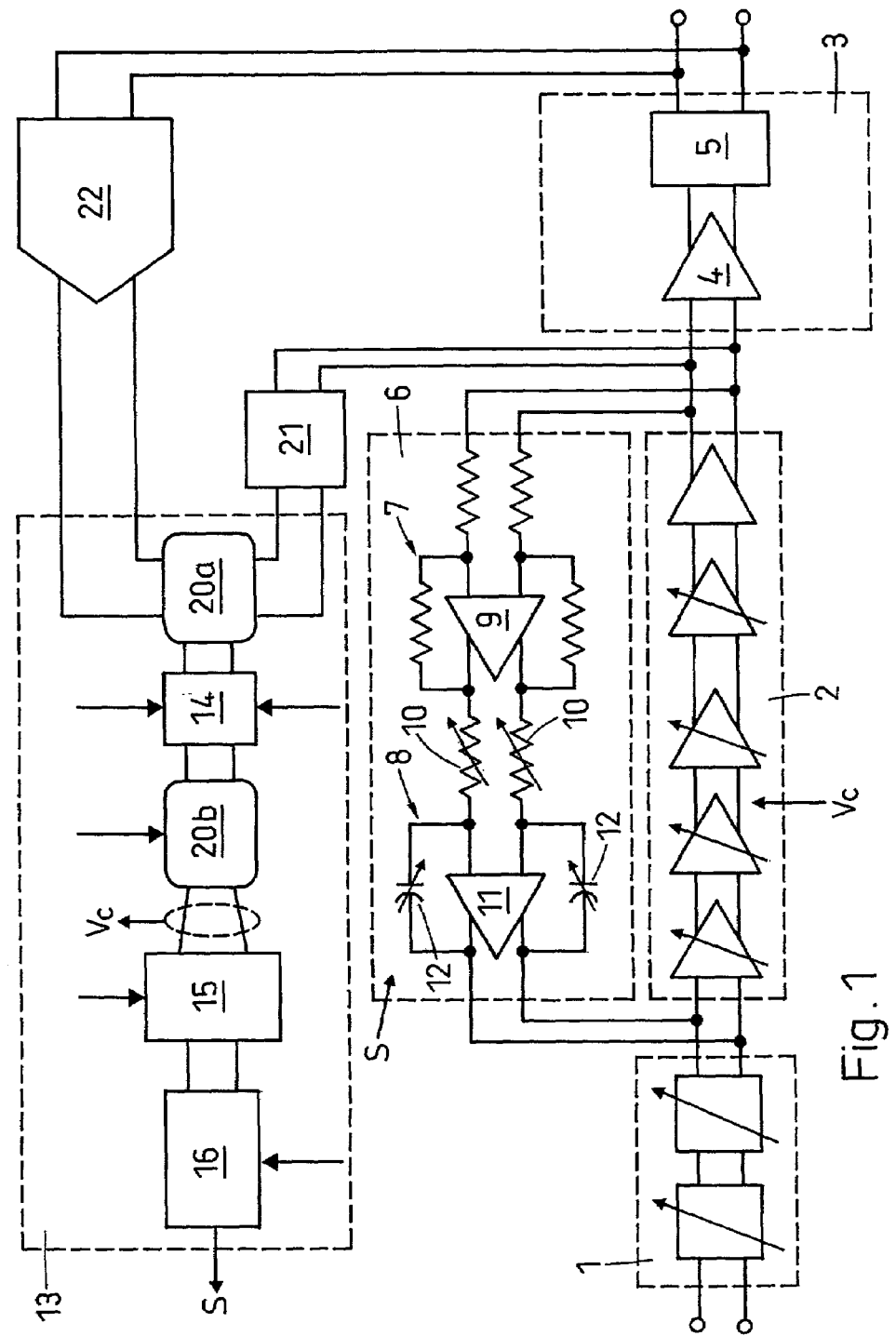
FIG. 1 shows an overview, partly a block diagram of an analog base band unit according to the invention, FIG. 2 a more detailed diagram of part of the reverse path unit of the embodiment according to FIG. 1, FIG. 3 a more detailed diagram of a first part of the control unit of the embodiment according to FIG. 1, FIG. 4 a more detailed diagram of a second part of the control unit of the embodiment according to FIG. 1, FIG. 5 the carrier to noise ratio at the output of an analog base band unit according to the invention processing a GPS signal, as a function of its bandwidth, and FIG. 6 correlation signals as functions of time shift of a GPS signal processed by an analog base band unit according to the invention, at different bandwidths.

The analog base band unit of FIG. 1 is part of a RF receiver also comprising an analog front end and a digital base band unit as well as auxiliary components as is well known in the art. The input receiving the output signal of a mixer is directly connected to a cascaded low pass filter 1. Low pass filter 1 has variable properties, so it can be calibrated to provide compensation for component tolerances and adapted to the chosen mode of operation. Its output is connected to the input of a variable gain amplifier unit 2 in the shape of an amplifier chain made up of series connected amplifiers at least part of which are controllable with respect to gain. As controllable amplifiers Gilbert cells or amplification cells with operational amplifiers may be employed. This will ensure high gain and control range, low phase noise and coherent amplification as required. With Gilbert cells an analog control voltage $V_c$ can be directly applied to control their gain whereas amplification cells have to be controlled via switching networks containing resistors and the analog control voltage $V_c$ will have to be converted to a digital signal controlling the switches via a discrete control interface. The variable gain amplifier unit 2 is followed by an A/D converter 3 consisting of a sampler 4 and a quantizer 5.

A reverse path unit 6 connects the output of variable gain amplifier unit 2 to its input, thus completing a feedback circuit containing the latter. It comprises an inverter network 7, followed by a tunable filter network 8. The inverter network 7 comprises a local feedback loop with an operational amplifier 9 and resistors in the local feedback loop as well as in series with the operational amplifiers. The filter network 8 comprises controllable variable resistances 10 in series with another feedback loop comprising an operational amplifier 11 with feedback via controllable variable capacitances 12. Together with the reverse path unit 6, variable gain amplifier unit 2 provides a feedback circuit offering variable gain amplification and at the same time controllable and adaptable suppression of DC and low frequency components.

For the purpose of controlling variable amplifier unit 2 and reverse path unit 6 a control unit 13 is provided which comprises an integrator 14 in series with a quantizer 15 for converting the output signal of integrator 14 to a digital signal and a decoder 16 for processing the same further to produce control signals for adapting the variable resistances 10 and variable capacitances 12 of reverse path unit 6.

Figure 3:
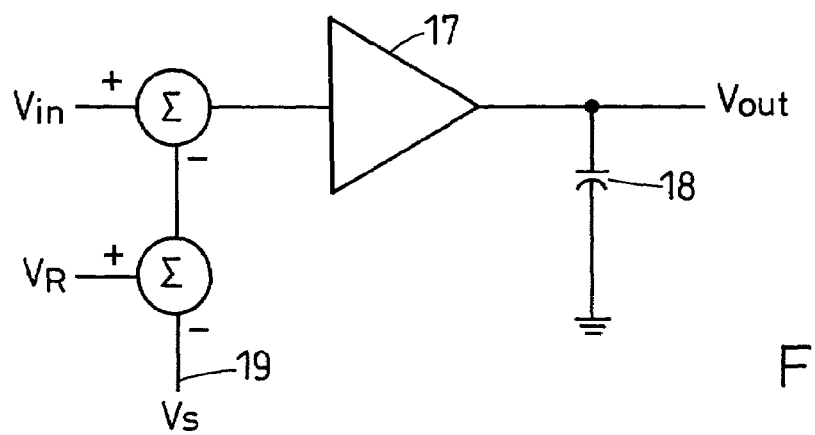

The integrator 14 comprises (FIG. 3) a transconductance 17 whose output is connected to ground via a condensor 18. Via a speed-up input 19 a signal can be applied which is added to the input voltage. If a speed-up signal in the shape of a pulsed negative speed-up voltage $V_s$ is applied the operation point of the loop is changed and excess charge removed from condensor 18. As a consequence, the settling time of the gain control loop is reduced. This feature provides short attack time and high dynamic range of the gain control for modes of operation where this is required.

Control unit 13 also comprises a first switchable selector 20a connecting one of two inputs to the input of integrator 14. A first input of selector 20a is connected to the output of a first monitoring unit, a synchronous AM detector 21 connected to the output of the variable gain amplifier unit 2. A second input of first selector 20a is connected to the output of a second monitoring unit, a control logic 22, e.g., a D/A converter to which the output signal of A/D converter 3 is fed. A second switchable selector 20b either connects the output of integrator 14 to the input of quantizer 15 or transmits a signal from the digital base band (not shown) to the same. The output voltage $V_c$ of second selector 20b is used as a gain control signal controlling the gain of variable gain amplifier unit 2.

Synchronous AM detector 21 comprises a full-wave rectifier and, optionally, a one-pole low pass filter. Control logic 22 can have high or low resolution according to requirements. Usually, low resolution will be sufficient.

Of the parallel variable resistances 10 each comprises—only the upper one will be described with reference to the drawings, the lower one being equal—a circuit containing (FIG. 2) resistors 23a–d of decreasing magnitude in parallel, each of them in series with one of switches 24a–d, as well as an additional switch 24e in parallel with resistors 23a–d. Via resistor 25 the circuit just described is connected to operational amplifier 11. Of the variable capacitances 12 of filter network 8 each comprises—here again only the upper one of capacitances 12 will be described—capacitors 26a,b in parallel. A switch 27a controls a loop containing capacitors 26a,b whereas a further switch 27b can be used to switch single capacitor 26b, which may be external, on and off.

Figure 2:
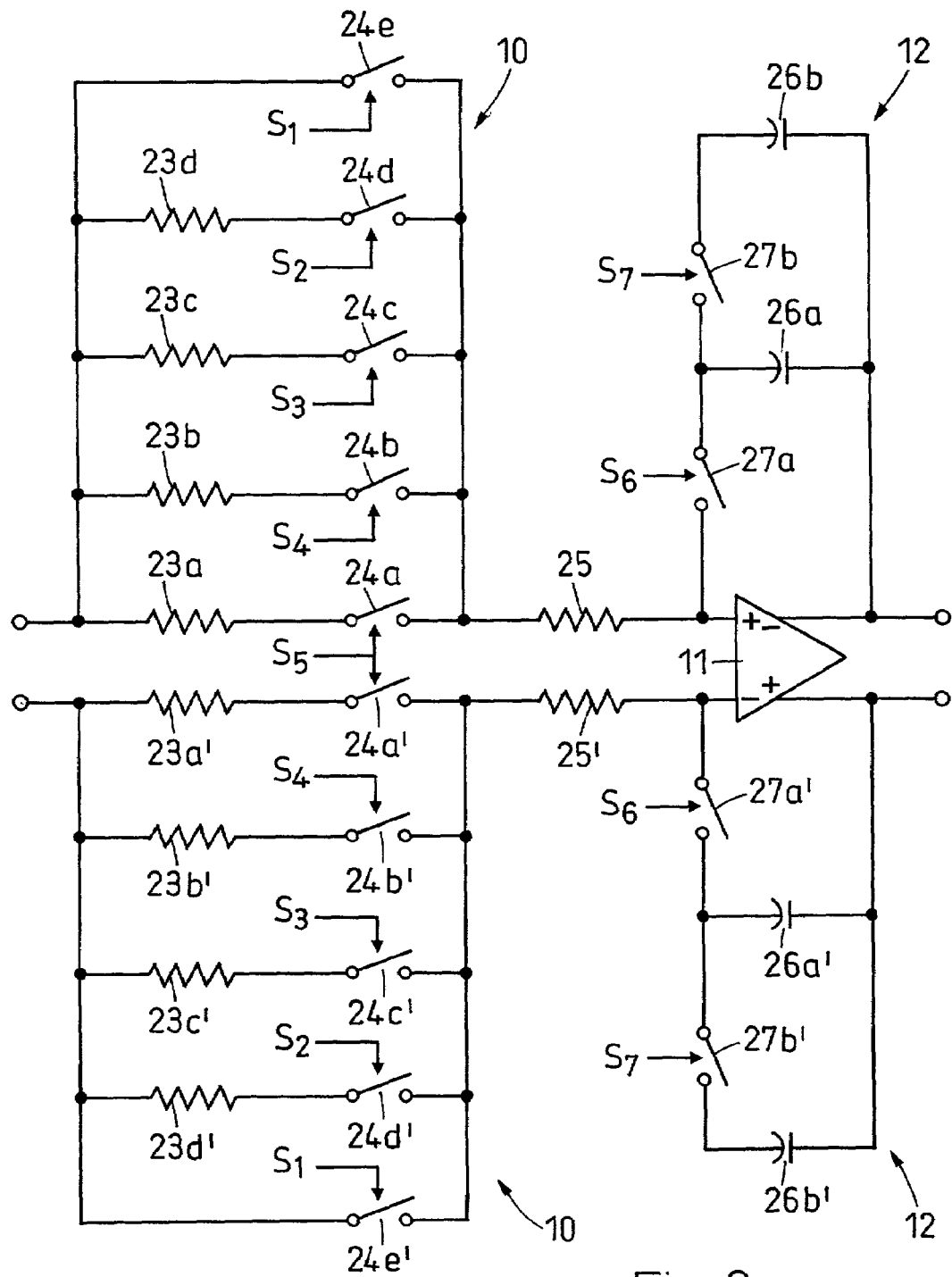
Figure 4:
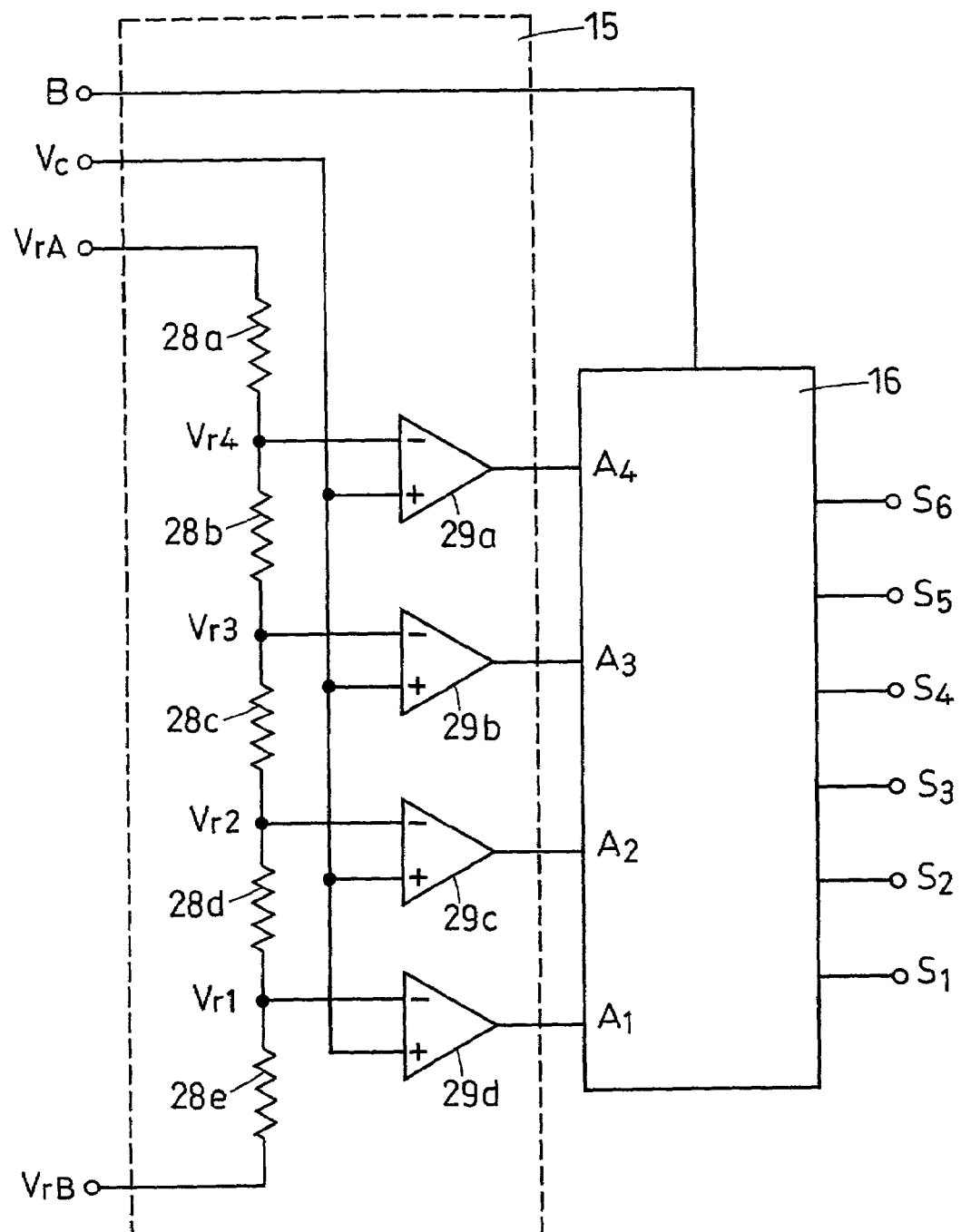

Quantizer 15 (FIG. 4) comprises a series of resistors 28a–e dividing the voltage span between a higher basic reference voltage $V_{rA}$ and a lower basic reference voltage $V_{rB}$ and thereby creating four reference voltages $V_{r1}$–$V_{r4}$ which are fed to the inverting inputs of four comparators 29a–d whereas the input signal, voltage $V_c$ from the output of second selector 20b which also controls variable amplifier unit 2, is fed to their non-inverting inputs in parallel. The either high or low output signals $A_1$–$A_4$ of comparators 29a–d amount to a 4-bit digital signal which represents the input signal voltage and is fed to the decoder 16 where it is decoded and converted to provide five components of a seven digital levels output signal whose digits directly control switches 24a–e, 24a'–e' in the filter network 8 of reverse path unit 6 as indicated in FIG. 2. The first five digits of the output signal S=(S1, . . . ,S7) are derived from input signals $A_1$–$A_4$ according to the following rules:

$S_1 = \overline{A_1}$
$S_2 = A_1\overline{A_2}$
$S_3 = A_2\overline{A_3}$
$S_4 = A_3\overline{A_4}$
$S_5 = A_4$ Consequently, $S_1$ is high if and only if the input voltage $V_c$ of quantizer 15 is smaller than the lowest of the reference voltages $V_{r1}$, $S_2$ is high if and only if $V_c$ is larger than first reference voltage $V_{r1}$ and smaller than second reference voltage $V_{r2}$ and so on. $S_5$ is high if and only if input voltage $V_c$ is larger than the highest reference voltage, $V_{r4}$. So if the voltage $V_c$—and, as a consequence, the gain of variable amplifier unit 2, is low—lower than $V_{r1}$—$S_1$ is high. Switches 24e, 24e' in variable resistances 10 of reverse path unit 6 are closed whereas the remaining switches there are open. The time constant of reverse path unit 6 is consequently small. With $V_c$ increasing, resistors 24d, 24d', then larger resistors 24c, 24c' etc. are activated in turn which results in a rise of the time constant. Switches 27a, 27a' in variable capacitances 12 are controlled by the sixth digit $S_6$ and are normally closed.

The sixth digit $S_6$ is a burst control signal corresponding to a signal B produced by the digital base band unit. In TDMA or similar modes where signal transmittance is by bursts $S_6$ is high during time-out, keeping switches 27a, 27a' open so that the charge is preserved in capacitances 12 and their proper function is assured from the beginning of the subsequent burst. Seventh digit $S_7$ controls switches 27b, 27b' whereby external capacitors 26b, 26b' can be added in parallel to capacitors 26a, 26a' to increase the time constant of reverse path unit 6. $S_7$ may be controllable directly by the user.

The analog base band unit described above operates as follows:

An input signal will usually contain blocking self-mixing signals which, however, are sufficiently suppressed by low pass filter unit 1. The resulting signal is fed to the feedback circuit made up of the variable gain amplifier unit 2 and the reverse path unit 6. The transfer function G(s) of variable gain amplifier unit 2 is essentially constant up to an upper cut-off frequency where it quickly falls off to zero. The transfer function F(s) of reverse path unit 6 is essentially $$F(s)=1/(s\tau) \tag{1}$$

where $\tau$ is the time constant and s the complex frequency. The transfer function H(s) of the subsystem is accordingly $$H(s)=G(s)/[1+G(s)F(s)]=s\tau G(s)/[s\tau+G(s)] \tag{2}$$

Obviously, H(0)=0, i.e., any DC offset present at the output of low pass filter 1 is eliminated. In addition to amplifying the signal with a gain controlled, as will be explained later, by control unit 13, the feedback circuit comprising variable gain unit 2 and reverse path unit 6 acts as a filter suppressing in particular DC and low frequency components from blocking and local oscillator self-mixing products.

With, e. g., a decrease in the gain and without compensating measures the cut-off frequency would decrease also which might compromise the function of the circuit. This can, however, be compensated for by an appropriate adaptation of the time constant $\tau$ of the reverse path unit 6. To this end, the states of switches 24a–e, 24 a'–e' and 27a,b, 27a', b' are in the way explained above - controlled by the reverse path control signal S produced by decoder 16 in such a way that the time constant $\tau$ changes roughly proportionally with the gain G(s), which itself changes essentially proportionally with the gain control signal, voltage Vc. As a consequence, H(s), the transfer function of the feedback circuit made up of variable gain amplifyer unit 2 and reverse path unit 6 is merely rescaled in proportion with the changes in the gain G(s), its shape remaining essentially constant.

Control voltage $V_c$ is produced in a way depending on the state of selectors 20a, 20b, which depend on the chosen mode of operation. For instance, if a GPS signal is being processed, first selector 20a connects control logic 22 to the input of integrator 14 whose output is transmitted to the input of quantizer 15 by second selector 20b. The burst control and speed-up features are not used. The digital signal at the output of A/D converter 3 is converted back into the analog domain, fed to integrator 14 and filtered. The relatively slowly varying output voltage VC is then, via the second selector 20b, applied to variable gain amplifier unit 2 as gain control signal. At the same time, it is fed to quantizer 15 and controls the time constant of reverse path unit 6 via decoder 16 and the switches in filter network 8 so as to stabilize the cut-off frequency of the feedback circuit consisting of variable gain amplifier 2 and reverse path unit 6 as explained above.

If an intermittent signal is being processed like in TDMA systems, the burst control feature is activated. With frequency hopping systems like bluetooth speed-up is active.

The variable properties of the reverse path unit 6 can additionally be exploited for a different purpose in that during processing of a GPS signal the bandwidth of the analog base band unit is adapted to the specific requirements of a signal acquisition phase and a tracking phase subsequent to acquisition of the signal, respectively.

Figure 5:
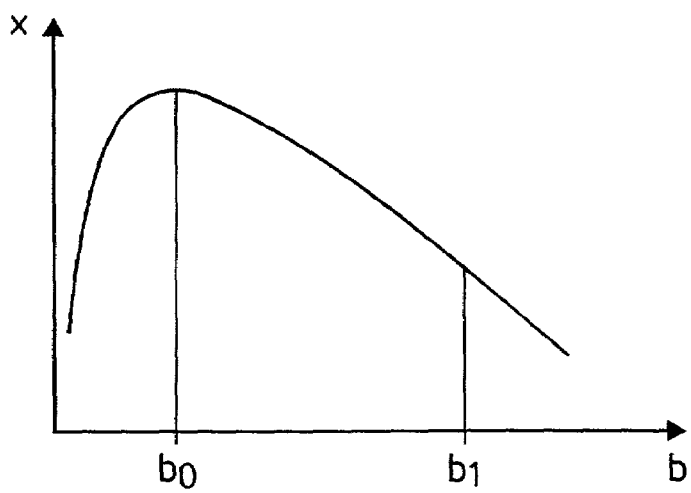

During acquisition of the signal it is advantageous to keep pre-correlation bandwidth relatively small in order to effectively suppress noise outside the signal band and achieve a high carrier to noise ratio at the output of A/D converter 3. The carrier to noise ratio x as a function of the bandwidth b (FIG. 5) has a maximum at a relatively small optimum value $b_o$ of the bandwidth where the pass band essentially coincides with the signal band. If the carrier to noise ratio x is at a maximum the sensitivity of the GPS receiver is optimal and search time and the probability of false alarm are small. Due to the specific properties of the GPS signal the optimum bandwidth $b_o$ is about 900 kHz. At higher bandwidths like $b_1$ the carrier to noise ratio x is considerably reduced.

Figure 6:
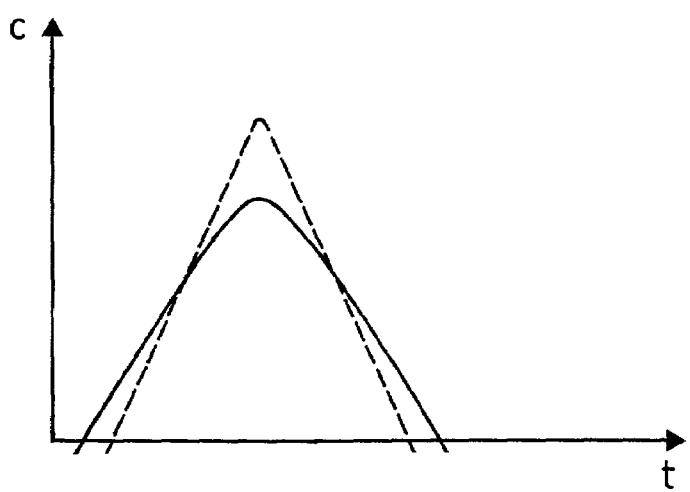

On the other hand, a small pre-correlation bandwidth of the system will lead to severe distortions of the correlation peak in particular where multi-path distortions are present (solid line in FIG. 6 where correlation c is shown as a function of time shift t). Consequently, it is advantageous to use a large pre-correlation bandwidth during the signal tracking phase subsequent to signal acquisition. A large pre-correlation bandwidth leads to a sharp peak in the correlation signal (dashed line in FIG. 6) and a correspondingly high level of the output discriminator value and allows for narrow correlation spacing. As a consequence, tracking error is low. For instance, with a pre-correlation bandwidth of 2 MHz 1-chip correlation spacing can be attained. 0.5-chip correlation spacing requires 4 MHz pre-correlation bandwidth. By further extension of the bandwidth correlation spacing and, as a consequence, tracking error can be reduced to very low values with limits determined mainly by constraints on power consumption. The pre-correlation bandwidth is determined by the bandwidth of the analog base band unit and can be adapted essentially by appropriately controlling reverse path unit 6.

In wireless communication systems, the specific capabilities of the analog base band unit according to the invention can be used to advantage in receivers for multiple wireless communication standards.

| List of reference symbols |
| --- |
| 1 low pass filter unit |
| 2 variable gain amplifier unit |
| 3 A/D converter |
| 4 sampler |
| 5 quantizer |
| 6 reverse path unit |
| 7 inverter network |
| 8 filter network |
| 9 operational amplifier |
| 10 variable resistances |

| List of reference symbols -continued |
| --- |
| 11 operational amplifier |
| 12 variable capacitances |
| 13 control unit |
| 14 integrator |
| 15 quantizer |
| 16 decoder |
| 17 transductance |
| 18 condenser |
| 19 speed-up input |
| 20a,b selectors |
| 21 synchronous AM detector |
| 22 logic circuit |
| 23a–d, 23a'–d' resistors |
| 24a–e, 24a'–e' switches |
| 25, 25' resistors |
| 26a,b, 26a',b' capacitors |
| 27a,b, 27a',b' switches |
| 28a–e resistors |
| 29a–d comparators |

The invention claimed is:

1. An analog base band unit for an RF receiver with a feedback circuit, comprising:
a variable gain amplifier unit configured to have a gain depending on a gain control signal derived from an output signal of the variable gain amplifier unit;
a reverse path unit configured to connect an output of the variable gain amplifier unit with an input of the variable gain amplifier unit; and
a control unit separate from the reverse path unit and configured to control at least one time constant of the reverse path unit dependent on the variable gain of the variable gain amplifier unit.

2. The analog base band unit according to claim 1, wherein the at least one time constant is controllable in such a way that the at least one time constant varies approximately proportionally with the gain.

3. The analog base band unit according to claim 1, wherein the variable gain amplifier unit is a variable gain amplifier chain including Gilbert cells or amplification cells comprising operational amplifiers and switching networks.

4. The analog base band unit according to claim 1, wherein the reverse path unit comprises a filter network defining the at least one time constant of the reverse path unit.

5. The analog base band unit according to claim 4, wherein the filter network comprises at least one variable resistance controllable by the control unit.

6. The analog base band unit according to claim 5, wherein the variable resistance comprises resistors, at least part of them each in series with at least one switch controllable by the control unit.

7. The analog base band unit according to claim 4, wherein the filter network comprises at least one variable capacitance controllable by the control unit.

8. The analog base band unit according to claim 7, wherein the at least one variable capacitance comprises capacitors, at least part of them in series each with at least one switch controllable by the control unit.

9. The analog base band unit according to claim 7, wherein the variable capacitance is part of a local feedback loop comprising an operational amplifier.

10. The analog base band unit according to claim 7, further comprising:

at least one switch configured to be controlled by a burst control signal to shut off the at least one variable capacitance in the reverse path unit.

11. The analog base band unit according to claim 1, wherein the control unit comprises:
a quantizer configured to compare an input signal voltage ($V_c$) with several reference voltages ($V_{r1}$—$V_{r4}$) and to provide digital output signals($A_1$—$A_4$), each reflecting the result of one of the voltage comparisons; and
a decoder configured to process the said digital signals to provide at least part of a reverse path control signal configured to control the time constant of the reverse path unit.

12. The analog base band unit according to claim 1, wherein the control unit comprises an integrator.

13. The analog base band unit according to claim 12, wherein the integrator has a speed-up input configured to receive a speed-up signal.

14. The analog base band unit according to claim 1, further comprising:
a selector configured to connect one of a plurality of inputs of the control unit to components of the control unit.

15. The analog base band unit according to claim 14, further comprising:
a first monitoring unit connected between the output of the variable gain amplifier unit and a first input of the selector.

16. The analog base band unit according to claim 14, further comprising:
an A/D converter configured to convert the output signal of the variable gain amplifier unit to a digital signal; and
a second monitoring unit connected between the output of the A/D converter and a second input of the selector.

17. The analog base band unit according to claim 16, wherein the second monitoring unit comprises a D/A converter or a logic control unit.

18. The analog base band unit according to claim 15, wherein the first monitoring unit is a synchronous AM detector.

19. The analog base band unit according to claim 1, further comprising:
an A/D converter configured to convert the output signal of the variable gain amplifier unit to a digital signal.

20. The analog base band unit according to claim 1, further comprising:
a low pass filter unit preceding the variable gain amplifier unit.

21. A method for using an analog base band unit to process a GPS signal, the analog base band unit including
a variable gain amplifier unit configured to have a gain depending on a gain control signal derived from an output signal of the variable gain amplifier unit,
a reverse path unit configured to connect an output of the variable gain amplifier unit with an input of the variable gain amplifier unit; and
a control unit configured to control at least one time constant of the reverse path unit dependent on the variable gain of the variable gain amplifier unit,
the method comprising:
processing the GPS signal with an acquisition bandwidth during a signal acquisition phase and with a larger tracking bandwidth during a subsequent signal tracking phase.

22. The method according to claim 21, wherein the tracking bandwidth is at least twice the acquisition bandwidth.

* * * * *